United States Patent
Chen et al.

(10) Patent No.: US 10,598,713 B2
(45) Date of Patent: Mar. 24, 2020

(54) ESD FAILURE EARLY WARNING CIRCUIT FOR INTEGRATED CIRCUIT

(71) Applicant: Fifth Electronics Research Institute of Ministry of Industry and Information Technology, Guangzhou (CN)

(72) Inventors: Yiqiang Chen, Guangzhou (CN); Ang Li, Guangzhou (CN); Dengyun Lei, Guangzhou (CN); Yunfei En, Guangzhou (CN); Lichao Hao, Guangzhou (CN); Wenxiao Fang, Guangzhou (CN); Bo Hou, Guangzhou (CN)

(73) Assignee: Fifth Electronics Research Institute of Ministry of Industry and Information Technology (CN)

(*) Notice: Subject to any disclaimer, the term of this patent is extended or adjusted under 35 U.S.C. 154(b) by 0 days.

(21) Appl. No.: 15/556,685

(22) PCT Filed: Nov. 29, 2016

(86) PCT No.: PCT/CN2016/107699
§ 371 (c)(1),
(2) Date: Sep. 8, 2017

(87) PCT Pub. No.: WO2017/201997
PCT Pub. Date: Nov. 30, 2017

(65) Prior Publication Data
US 2019/0079126 A1    Mar. 14, 2019

(30) Foreign Application Priority Data
May 26, 2016 (CN) .......... 2016 1 0368061

(51) Int. Cl.
*G01R 31/00* (2006.01)
*H01L 27/02* (2006.01)
(Continued)

(52) U.S. Cl.
CPC .......... *G01R 31/002* (2013.01); *G05F 3/205* (2013.01); *H01L 27/0255* (2013.01);
(Continued)

(58) Field of Classification Search
CPC ....... G01R 31/002; G01R 31/28; G05F 3/205; H01L 27/0255; H01L 27/0288;
(Continued)

(56) References Cited

U.S. PATENT DOCUMENTS 6,060,752 A * 5/2000 Williams ............ H01L 27/0255
257/355
2007/0146055 A1   6/2007 Iwabuchi et al.
(Continued)

FOREIGN PATENT DOCUMENTS

CN    1992489 A    7/2007
CN    101762781 A    6/2010
(Continued)

OTHER PUBLICATIONS

Machine translation of Li et al. Chinese Patent Document CN 101762781 A Jun. 30, 2010 (Year: 2010).*
(Continued)

*Primary Examiner* — Kevin J Comber
(74) *Attorney, Agent, or Firm* — Lerner, David, Littenberg, Krumholz & Mentlik, LLP

(57) ABSTRACT

An ESD failure early warning circuit for an integrated circuit is disclosed, including a positive voltage stress generation module, a negative voltage stress generation module, a buck module, a warning output module, capacitors C006, C007, and diodes D001, D002, D003, D004 and D005. The ESD failure early warning circuit can report a warning timely when there is an ESD event in the monitored integrated circuit, to improve the reliability of the device effectively. Moreover, the stress voltage generated by the positive
(Continued)

voltage stress generation module and the negative voltage stress generation module is adjustable, so the stress voltage can be set flexibly by a user according to actual condition of the monitored integrated circuit. The present invention has high flexibility and wide application prospect.

11 Claims, 8 Drawing Sheets

(51) Int. Cl.
  *G05F 3/20* (2006.01)
  *H02H 9/04* (2006.01)
  *H02M 3/07* (2006.01)
  *G01R 31/28* (2006.01)
(52) U.S. Cl.
  CPC ...... *H01L 27/0266* (2013.01); *H01L 27/0288* (2013.01); *H02H 9/046* (2013.01); *H02M 3/07* (2013.01); *G01R 31/2884* (2013.01); *H02M 2003/071* (2013.01)
(58) Field of Classification Search
  CPC ................ H01L 27/0266; H02M 3/07; H02M 2003/071; H02H 9/046

USPC .......................................................... 361/56
See application file for complete search history.

(56) References Cited

U.S. PATENT DOCUMENTS

| 2014/0107961 | A1 | 4/2014 | Chen et al. |
| 2014/0211347 | A1 | 7/2014 | Steinhoff et al. |
| 2014/0303920 | A1 | 10/2014 | Chou et al. |

FOREIGN PATENT DOCUMENTS

| CN | 102759688 A | 10/2012 |
| CN | 103308848 A | 9/2013 |
| CN | 103630801 A | 3/2014 |
| CN | 103698692 A | 4/2014 |
| CN | 105049021 A | 11/2015 |
| CN | 204832431 U | 12/2015 |
| CN | 105954670 A | 9/2016 |

OTHER PUBLICATIONS

International Search Report for Application No. PCT/CN2016/107699 dated Apr. 24, 2017, 5 pages.

* cited by examiner

ESD FAILURE EARLY WARNING CIRCUIT FOR INTEGRATED CIRCUIT

CROSS REFERENCE TO RELATED APPLICATIONS

The present application is a national phase entry under 35 U.S.C. § 371 of International Application No. PCT/CN2016/107699, filed Nov. 29, 2016, which claims priority from Chinese Patent Application No. 201610368061.2 filed May 26, 2016, all of which are hereby incorporated herein by reference.

FIELD

The present disclosure relates to the field of reliability of semiconductor devices, and more particularly, to an ESD failure early warning circuit for an integrated circuit.

BACKGROUND

Semiconductor devices have always been facing reliability problems caused by electrostatic discharge (ESD). In particular, as feature sizes of devices decrease continuously, thickness of a gate terminal oxide layers is thinned continuously, and the integration level is improved continuously, the ESD problem becomes more and more serious. At present, the guarantee of reliability of devices has turned from the reliability test and screening for the reliability of final products, to process control, enhancement of synergy between design of reliability and function, and design of prognostics and health management (PHM). Therefore, it is necessary to provide a failure early warning circuit to address the problem of ESD failure in semiconductor devices in an integrated circuit, to ensure the reliability of semiconductor devices.

SUMMARY

Based on the above, in order to address the problems in the prior art, an objective of the present disclosure is to provide an ESD failure early warning circuit for an integrated circuit. As a PHM technology, the ESD failure early warning circuit can achieve early warning of a failure caused by ESD for an integrated circuit effectively, to improve the reliability of devices.

In order to achieve the above objective, the present disclosure provides the following technical solution.

An ESD failure early warning circuit for an integrated circuit is provided, including: a positive voltage stress generation module, a negative voltage stress generation module, a buck module, a warning output module, capacitors C006, C007, and diodes D001, D002, D003, D004 and D005, wherein:

- one end of the capacitor C007 is coupled to an output terminal of the positive voltage stress generation module and another end of the capacitor C007 is grounded;
- an anode terminal of the diode D005 is grounded, and a cathode terminal of the diode D005 is coupled to an output terminal of the positive voltage stress generation module and an input terminal of the buck module respectively;
- one end of the capacitor C006 is coupled to the cathode terminal of the diode D005, and another end of the capacitor C006 is coupled to an output terminal of the negative voltage stress generation module and an anode terminal of the diode D003 respectively;
- an cathode terminal of the diode D004 is coupled to the output terminal of the positive voltage stress generation module, and an anode of the diode D004 is coupled to an cathode terminal of the diode D003, an anode terminal of the diode D001 and a cathode terminal of the diode D002 respectively;
- a cathode terminal of the diode D001 is coupled to a voltage source, and an anode terminal of the diode D002 is grounded; and
- an input terminal of the warning output module is coupled to an output terminal of the buck module.

With the above technical solutions provided in the present disclosure, both the capacitors C006 and C007 are test capacitors, positive voltage stress generated by the positive voltage stress generation module is applied on the capacitor C007, and negative voltage stress generated by the negative voltage stress generation module is applied on the capacitor C006. When a positive or negative ESD event occurs on a monitored integrated circuit and the test capacitors are broken down, the warning output module can report a warning timely, and the positive voltage stress generation module and the negative voltage stress generation module can be switched off through a feedback circuit, to avoid extra power consumption. The ESD failure early warning circuit for the integrated circuit according to the present disclosure can report a warning timely when there is an ESD event in the monitored integrated circuit, to improve the reliability of the device effectively. Moreover, the stress voltage generated by the positive voltage stress generation module and the negative voltage stress generation module is adjustable, so the stress voltage can be set flexibly by a user according to actual condition of the monitored integrated circuit. The present invention has high flexibility and wide application prospect.

DETAILED DESCRIPTION

Technical schemes of the present disclosure will be described clearly and completely in conjunction with accompanying drawings. The implementations illustrated below are merely part rather than all of the present disclosure. Any other implementation obtained by one skilled in the art based on the implementations described herein without creativity work should fall into the protective scope of the present disclosure. It will be understood that although the terms "first" and "second" may be used herein to describe various elements, these elements should not be limited by these terms, unless the context indicates otherwise. These terms may be used to distinguish one element from another element. Thus, a first element discussed below could be termed a second element, and similarly, a second element discussed below could be termed a first element without departing from the teachings of the present invention. It should be noted that the drawings only show elements related to the disclosure for illustration purposes.

Figure 1:
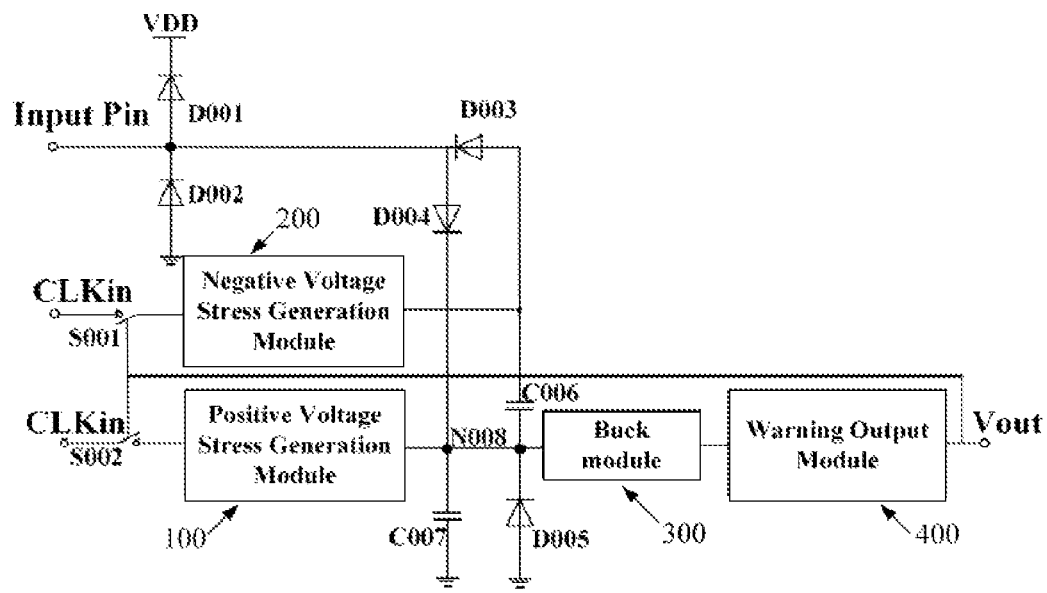
FIG. 1 is a schematic diagram illustrating a ESD failure early warning circuit for an integrated circuit according to one embodiment of the present disclosure.

FIG. 1 is a schematic diagram illustrating a ESD failure early warning circuit for an integrated circuit according to one embodiment of the present disclosure. As shown in FIG. 1, the ESD failure early warning circuit in this embodiment may include a positive voltage stress generation module 100, a negative voltage stress generation module 200, a buck module 300, a warning output module 400, capacitors C006 and C007, and diodes D001, D002, D003, D004 and D005.

One end of the capacitor C007 is coupled to an output terminal of the positive voltage stress generation module and another end of the capacitor C007 is grounded; an anode terminal of the diode D005 is grounded, and a cathode terminal of the diode D005 is coupled to an output terminal of the positive voltage stress generation module and an input terminal of the buck module respectively; one end of the capacitor C006 is coupled to the cathode terminal of the diode D005, and another end of the capacitor C006 is coupled to an output terminal of the negative voltage stress generation module and an anode terminal of the diode D003 respectively; an cathode terminal of the diode D004 is coupled to the output terminal of the positive voltage stress generation module, and an anode of the diode D004 is coupled to an cathode terminal of the diode D003, an anode terminal of the diode D001 and a cathode terminal of the diode D002 respectively; a cathode terminal of the diode D001 is coupled to a voltage source, and an anode terminal of the diode D002 is grounded; and an input terminal of the warning output module is coupled to an output terminal of the buck module.

With reference to FIG. 1, the ESD failure early warning circuit in this embodiment works as below. The positive voltage stress generated by the positive voltage stress generation module 100 is greater than the positive voltage stress applied on MOS transistors in the monitored integrated circuit, the negative voltage stress generated by the negative voltage stress generation module 200 is greater than the negative voltage stress applied on MOS transistors in the monitored integrated circuit, and the capacitors C006 and C007 are the test capacitors. The positive voltage stress generated by the positive voltage stress generation module 100 is applied on the capacitor C007, and the negative voltage stress generated by the negative voltage stress generation module 200 is applied on the capacitor C006. When an ESD event occurs in the Input Pin end, and the ESD event is not filtered out by the ESD clamping circuit made up of the diode D001 and D002, this ESD event may be coupled to the test capacitor through the diodes D003 and D004. If a positive ESD event occurs, this event may be coupled to the capacitor C007 through diode D004; and if a negative ESD event occurs, this event may be coupled to the capacitor C006 through diode D003. The role of the diode D005 is to prevent the capacitor C007 from being affected by the negative ESD event. When the test capacitors have not been broken down, a node N008 is kept at a relatively high positive voltage, the buck module 300 reduces the voltage of the high stress voltage to protect the devices in the warning output module 400, and the output terminal of the warning output module 400 is kept at a high level voltage. If one of the test capacitors is broken down, the voltage of the node N008 is reduced (that is, the voltage of the node N008 is lower than the reference voltage of the warning output module 400), the level voltage at the output terminal of the warning output module 400 is transformed from a high level to a low level, and a warning is reported.

Preferably, the ESD failure early warning circuit in this embodiment may further include controllable switches S001 and S002. A clock input terminal of the positive voltage stress generation module is coupled to an external clock signal through the controllable switch S002, and a clock input terminal of the negative voltage stress generation module is coupled to an external clock signal through the controllable switch S001. An output terminal of the warning output module is coupled to a control terminal of the controllable switch S001 and a control terminal of the controllable switch S002 respectively. If one of the test capacitors is broken down, the voltage at the node N008 may be reduced (that is, the voltage is lower than the reference voltage of the warning output module 400), the level voltage at the output terminal of the warning output module 400 is transformed from a high level to a low level. At this time, in addition to reporting a warning, the controllable switches S001 and S002 may be switched off through a feedback circuit, so that the positive voltage stress generation module 100 and the negative voltage stress generation module 200 may be switched off to avoid extra power consumption. The controllable switches S001 and S002 may be selected from a variety of switching devices, such as a silicon-controlled MOS transistor switch, or other controllable modules with a switching function, which is not limited in this embodiment.

For the ESD failure early warning circuit in this embodiment, the value of the voltage generated by each of the positive voltage stress generation module 100 and the negative voltage stress generation module 200 may be customized by a user. The user may flexibly set the value according to actual condition of the monitored integrated circuit, so that when there is an ESD event in the monitored integrated circuit, a warning can be reported timely to improve the reliability of the device effectively.

Figure 2:
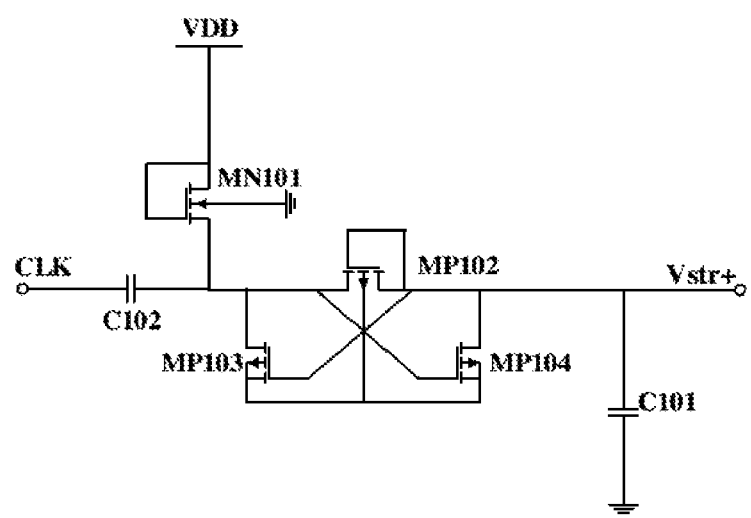
FIG. 2 is a schematic diagram illustrating a circuit configuration of a positive voltage stress generation module according to one embodiment of the present disclosure.

In an alternative embodiment, with reference to FIG. 2 together with FIG. 1, the positive voltage stress generation module 100 may include capacitors C101 and C102, a NMOS transistor MN101, and PMOS transistors MP102, MP103 and MP104. Each of the PMOS transistors MP103 and MP104 has a substrate and a source terminal coupled to the substrate. One end of the capacitor C102 is a clock input terminal of the positive voltage stress generation module, and another end of the capacitor C102 is coupled to a source terminal of the NMOS transistor MN101. A gate terminal and a drain terminal of the NMOS transistor MN101 are coupled to the voltage source, a source terminal of the NMOS transistor MN101 is coupled to a source terminal of the PMOS transistor MP102, a drain terminal of the PMOS transistor MP103 and a gate terminal of the PMOS transistor MP104 respectively, a substrate of the NMOS transistor MN101 is grounded. One end of the capacitor C101 is grounded, and another end of the capacitor C101 is coupled to a drain terminal and a gate terminal of the PMOS transistor MP102 respectively. A drain terminal of the PMOS transistor MP102 is coupled to a gate terminal of the PMOS transistor MP103 and a drain terminal of PMOS transistor MP104 respectively, a substrate of the PMOS transistor MP102 is coupled to a source terminal of the PMOS transistor MP103 and a source terminal of the PMOS transistor MP104 respectively.

The PMOS transistors MP103 and MP104 control the voltage of the substrate of the PMOS transistor MP102 to be always equal to the highest of the voltages at the source terminal and the drain terminal of the PMOS transistor MP102, to prevent a positively biased PN junction forming between the source terminal and the substrate, or the drain terminal and the substrate of the PMOS transistor MP102. The capacitor C101 is an output capacitor, a drain terminal and a gate terminal of the PMOS transistor MP102 are coupled to an end of the capacitor C101 respectively, and another end of the capacitor C101 is grounded. Since the gate terminal of the PMOS transistor MP102 is coupled to the drain terminal of the PMOS transistor MP102, there is loss of the threshold voltage Vth in the output voltage, and the output voltage Vstr+ at the drain terminal of the PMOS transistor MP102 is 2VDD-Vth.

Figure 3:
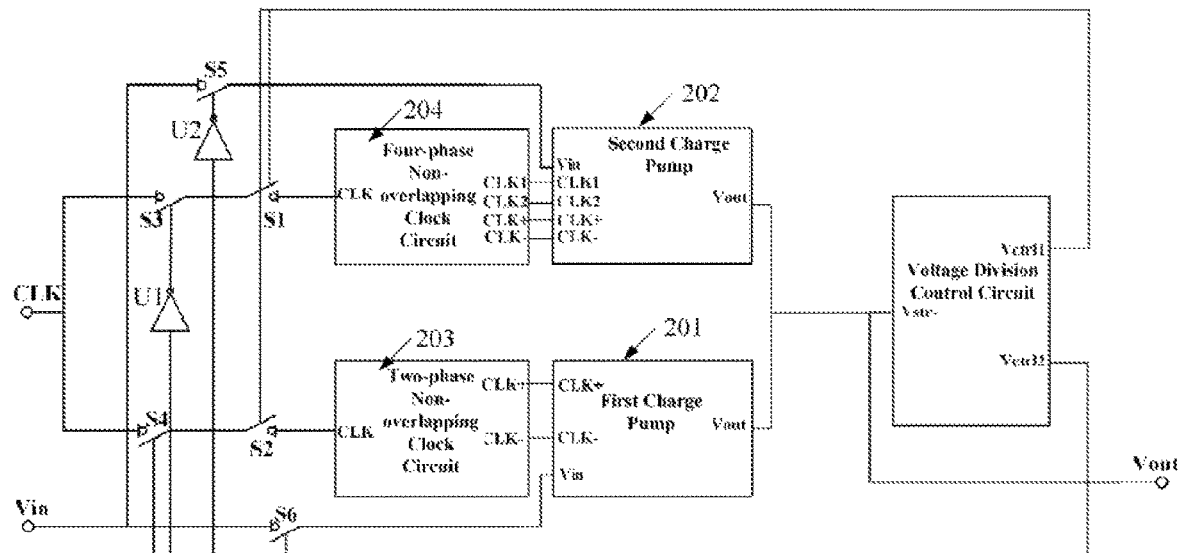
FIG. 3 is a schematic diagram illustrating a circuit configuration of a negative voltage stress generation module according to one embodiment of the present disclosure.

In an alternative embodiment, with reference to FIG. 3 together with FIGS. 1-2, the negative voltage stress generation module 200 may include controllable switches S1, S2, S3, S4, S5 and S6, a first charge pump 201, a second charge pump 202, a two-phase non-overlap clock circuit 203, a four-phase non-overlap clock circuit 204, inverters U1 and U2, and a voltage division control circuit 205.

Each of the controllable switches S1, S2, S3, S4, S5 and S6 include a first terminal, a second terminal, and a control terminal configured to control the first terminal and the second terminal to be switched on. The controllable switches may be selected from a variety of switching devices, such as a silicon-controlled MOS transistor switch, or other controllable modules with a switching function, which is not limited in this embodiment.

The first terminal of the controllable switch S2 is coupled to the second terminal of the controllable switch S4, the second terminal of the controllable switch S2 is coupled to a clock input terminal of the two-phase non-overlap clock circuit 203, and a clock output terminal of the two-phase non-overlap clock circuit 203 is coupled to a clock input terminal of the first charge pump 201.

The first terminal of the controllable switch S1 is coupled to the second terminal of the controllable switch S3, the second terminal of the controllable switch S1 is coupled to a clock input terminal of the four-phase non-overlap clock circuit 204, and a clock output terminal of the four-phase non-overlap clock circuit 204 is coupled to a clock input terminal of the second charge pump 202.

The first terminal of the controllable switch S3 is a clock input terminal of the negative voltage stress generation module 200, and the first terminal of the controllable switch S3 is coupled to the first terminal of the controllable switch S4. The first terminal of each of the controllable switches S5 and S6 is coupled to the voltage source, the second terminal of the controllable switch S6 is coupled to a voltage input terminal of the first charge pump 201, the second terminal of the controllable switch S5 is coupled to a voltage input terminal of the second charge pump 202, and both an output terminal of the first charge pump 201 and an output terminal of the second charge pump 202 are coupled to an input terminal of the voltage division control circuit 205.

The first control signal output terminal of the voltage division control circuit 205 is coupled to the control terminal of each of the controllable switches S1 and S2 respectively, a second control signal output terminal of the voltage division control circuit 205 is coupled to the control terminal of each of the controllable switches S4, S6, an input terminal of the inverter U1 and an input terminal of the inverter U2 respectively. An output terminal of the inverter U1 is coupled to the control terminal of the controllable switch S3, and an output terminal of the inverter U2 is coupled to the control terminal of the controllable switch S5.

With reference to FIG. 3 together with FIGS. 1 and 2, the two-phase non-overlap clock circuit 203 may drive the first charge pump 201, the four-phase non-overlap clock circuit 204 may drive the second charge pump 202, and the two charge pumps are connected in parallel to output a negative voltage Vstr− as the output of the negative voltage stress generation module 200. At the same time, the voltage division control circuit 205 controls the operating conditions of the first charge pump 201 and the second charge pump 202 and the on-off of the two-phase non-overlap clock circuit 203 and the four-phase non-overlap clock circuit 204 based on the negative voltage Vstr−. The voltage division control circuit 205 may generate a first control signal Vctrl1 based on the negative voltage Vstr−, and output the first control signal Vctrl1 to the control terminals of the controllable switches S1 and S2 through the first control signal output terminal, to control the on-off of the controllable switches S1 and S2. The voltage division control circuit 205 may also generate a second control signal Vctrl2 based on the negative voltage Vstr−, and output the second control signal Vctrl2 to the control terminals of the controllable switches S4 and S6 through the first control signal output terminal, and to the controllable switches S3 and S5 through the inverters U1 and U2, to control the on-off of the controllable switches S3, S4, S5 and S6. For example, assumed that each controllable switch is enabled at a high level voltage, that is, the first terminal of the controllable switch is connected to the second terminal of the controllable switch when the control terminal of the controllable switch is coupled to a high level voltage. In this case, when Vctrl1 is at a low level voltage, both the controllable switches S1 and S2 are switched off, and both the first charge pump 201 and the second charge pump 202 stop working. When Vctrl1 is at a high level voltage, both the controllable switches S1 and S2 are switched on, and at this point if Vctrl2 is at a high level voltage, both the controllable switches S4 and S6 are switched on, and both the controllable switches S3 and S5 are switched off, the two-phase non-overlap clock circuit 203 and the first charge pump 201 begin to work, while the four-phase non-overlap clock circuit 204 and the second charge pump 202 stop working. If Vctrl2 is at a low level voltage, the controllable switches S4 and S6 are switched off, and the controllable switches S3 and S5 are switched on, the two-phase non-overlap clock 203 and the first charge pump 201 stop working, while the four-phase non-overlap clock 204 and the second charge pump 202 begin to work. The first charge pump 201 or the second charge pump 202 may be selected by the voltage division control circuit 205 to output a continuously adjustable negative voltage, so duration of usage of the charge pump under the high level voltage may be reduced, to improve the reliability of the charge pump. In addition, if one of the charge pumps or its corresponding clock circuit fails, the other charge pump may be controlled to enter the working state.

In an alternative embodiment, with reference to FIG. 4 and FIGS. 1 to 3, the first charge pump 201 may include capacitors C208*a*, C209*a* and C210*a* and PMOS transistors MP201*a*, MP202*a*, MP203*a*, MP204*a*, MP205*a*, MP206*a* and MP207*a*. Each of the PMOS transistors MP202*a*, MP203*a*, MP205*a* and MP206*a* has a substrate and a source terminal coupled to the substrate. An end of the capacitor C208*a* is coupled to the clock output CLK− of the two-phase non-overlap clock circuit 203, another end of the capacitor C208*a* is coupled to a drain terminal of the PMOS transistor MP206. A gate terminal of the PMOS transistor MP204*a* is coupled to a second clock output terminal CLK+ of the two-phase non-overlap clock circuit 203 through the capacitor C209*a*, a drain terminal of the PMOS transistor MP204*a* is coupled to a drain terminal of the PMOS transistor MP206*a*, a gate terminal of the PMOS transistor MP201*a* and a gate terminal of the PMOS transistor MP205*a* respectively, a source terminal of the PMOS transistor MP204*a* is coupled to a drain terminal of the PMOS transistor MP205*a*, a gate terminal of the PMOS transistor MP206*a*, a drain terminal of the PMOS transistor MP201*a*, a drain terminal of the PMOS transistor MP202*a* and a gate terminal of the PMOS transistor MP203*a* respectively, and the substrate of the PMOS transistor MP204*a* is coupled to a source terminal of the PMOS transistor MP205*a* and a source terminal of the PMOS transistor MP206*a* respectively, and a drain terminal of the PMOS transistor MP205*a* is a voltage input terminal. A source terminal of the PMOS transistor MP201*a* is coupled to a gate terminal of the PMOS transistor MP204*a*, a drain terminal and a gate terminal of the PMOS transistor MP207*a*, a drain terminal of the PMOS transistor MP203*a* and a gate terminal of the PMOS transistor MP202*a* respectively, and a substrate of the PMOS transistor MP201*a* is coupled to a substrate of the PMOS transistor MP207*a*, a source terminal of the PMOS transistor MP202*a*, and a source terminal of the PMOS transistor MP203*a* respectively. An end of the capacitor C210*a* is grounded, and another end of the capacitor C210*a* is coupled to a source terminal of the PMOS transistor MP207*a*. The drain terminal of the PMOS transistor MP205*a* is a voltage input terminal Vin.

Figure 4:
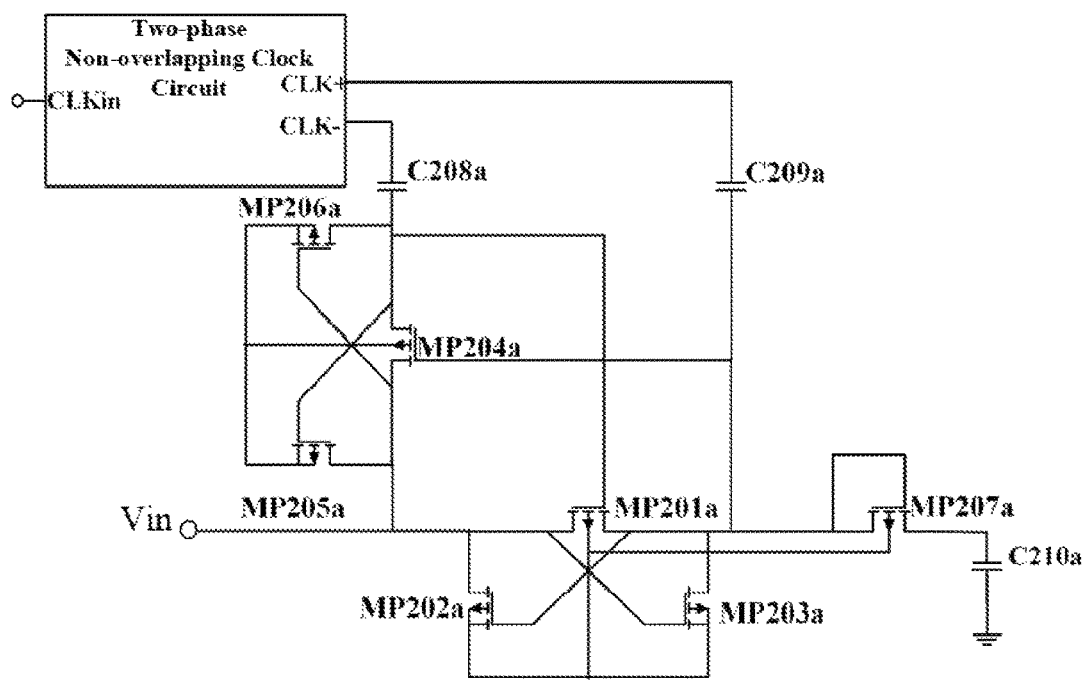
FIG. 4 is a schematic diagram illustrating a circuit configuration of a first charge pump according to one embodiment of the present disclosure.

With reference to FIG. 4 together with FIGS. 1 to 3, the role of the first charge pump 201 is to generate a continuously adjustable negative voltage from −Vmax/2 to 0 V, where −Vmax represents the minimum negative voltage output by the negative voltage stress generation module 200. The PMOS transistors MP202*a* and MP203*a* control the voltages of the substrates of PMOS transistors MP201*a* and MP207*a* to be always equal to the highest one of voltages at the source terminal and the drain terminal of the PMOS transistor MP201*a*, and the PMOS transistors MP205*a* and MP206*a* control the voltage of the substrate of PMOS transistor MP204*a* to be always equal to the highest of voltages at the source terminal and the drain terminal of the PMOS transistor MP204*a*, to prevent a positively biased PN junction forming between the source or drain terminal and the substrate of each of the PMOS transistors MP201*a*, MP204*a* and MP207*a*. With reference to FIG. 4, the first charge pump 201 works as below. When the first clock output terminal CLK− of the two-phase non-overlap clock circuit 203 outputs a low level voltage, and the second clock output terminal CLK+ of the two-phase non-overlap clock circuit 203 outputs a high level voltage, the voltage at the drain terminal of the PMOS transistor MP201*a* is −VDD, and the PMOS transistor MP201 works in a linear region. At this time, the PMOS transistor MP201*a* acts as a resistor, and the voltage at the source terminal of the PMOS transistor MP201*a* may be reduced to the voltage at the drain terminal f the PMOS transistor MP201*a*, and not be affected by the threshold voltage Vth. When the first clock output CLK− of the two-phase non-overlap clock circuit 203 outputs a high level voltage, and the second clock output CLK+ of the two-phase non-overlap clock circuit 203 outputs a low level voltage, and the PMOS transistor MP204*a* is switched on. At this time the PMOS transistor MP201*a* acts as a reverse-biased diode, so the source terminal of the PMOS transistor MP201*a* has a constant negative bias voltage. The PMOS transistor MP207*a* acts as an isolating diode, which reduces the voltage fluctuation on the output of the capacitor C210*a*. However, due to the presence of the PMOS transistor MP207*a*, the negative bias voltage output by the capacitor C210*a* is lower than the voltage at the source terminal of the PMOS transistor MP201*a* by a threshold voltage Vth.

It should be noted that the first charge pump 201 may have a variety of circuit configurations, and only one circuit configuration is described in this embodiment, which does not limit the scope of the present disclosure.

Figure 5:
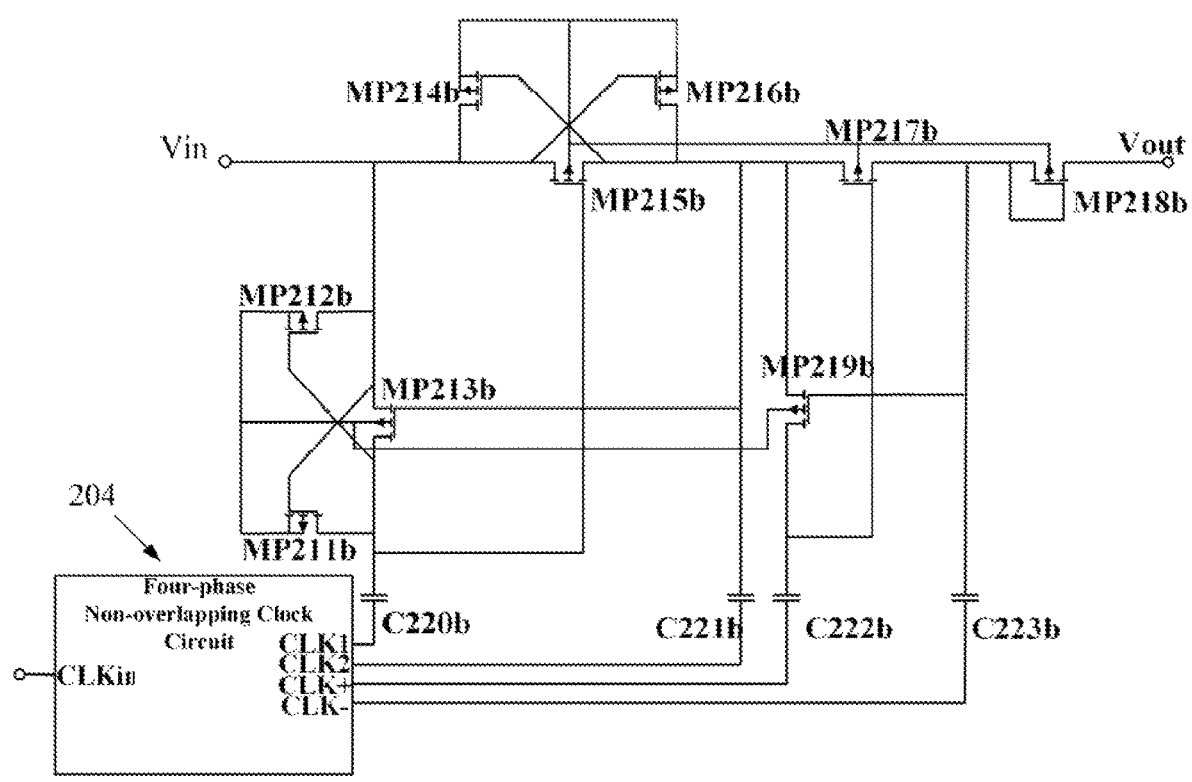
FIG. 5 is a schematic diagram illustrating a circuit configuration of a second charge pump according to one embodiment of the present disclosure.

In an alternative embodiment, with reference to FIG. 5 together with FIGS. 1 to 4, the second charge pump includes capacitors C220*b*, C221*b*, C222*b* and C223*b*, and PMOS transistors MP211*b*, MP212*b*, MP213*b*, MP214*b*, MP215*b*, MP216*b*, MP217*b*, MP218*b* and MP219*b*. Each of the PMOS transistors MP211*b*, MP212*b*, MP214*b* and MP216*b* has a substrate and a source terminal coupled to the substrate. One end of the capacitor C220*b* is coupled to a first clock output terminal CLK1 of the four-phase non-overlap clock circuit 204, and another end of the capacitor C220*b* is coupled to a drain terminal of the PMOS transistor MP211*b* and a gate terminal of the PMOS transistor MP215*b* respectively. A gate terminal of the PMOS transistor MP213*b* is coupled to a source terminal of the PMOS transistor MP215*b*, a drain terminal of the PMOS transistor MP216*b*, a drain terminal of the PMOS transistor MP217*b*, and a source terminal of the PMOS transistor MP219*b* respectively, a source terminal of the PMOS transistor MP213*b* is coupled to a source terminal of the PMOS transistor MP211*b*, a drain terminal of the PMOS transistor MP212*b*, a drain terminal of the PMOS transistor MP214*b*, a drain terminal of the PMOS transistor MP215*b* and a gate terminal of the PMOS transistor MP216*b*, a drain terminal of the PMOS transistor MP213*b* is coupled to a drain terminal of the PMOS transistor MP211*b* and a gate terminal of the PMOS transistor MP212*b*, and the substrate of the PMOS transistor MP213*b* is coupled to a source terminal of the PMOS transistor MP211*b*, a source terminal of the PMOS transistor MP212*b*, and the substrate of the PMOS transistor MP219*b* respectively. One end of the capacitor C221*b* is coupled to a second clock output terminal CLK2 of the four-phase non-overlap clock circuit 204, and another end of the capacitor C221*b* is coupled to a gate terminal of the PMOS transistor MP213*b*. A source terminal of the PMOS transistor MP215*b* is coupled to a gate terminal of the PMOS transistor MP214*b*, the substrate of the PMOS transistor MP215*b* is coupled to a source terminal of the PMOS transistor MP214*b*, a source terminal of the PMOS transistor MP216*b*, a substrate of the PMOS transistor MP217*b* and the substrate of the PMOS transistor MP218*b* respectively, and a drain terminal of the PMOS transistor MP215b is a voltage input terminal. A gate terminal of the PMOS transistor MP219b is coupled to a source terminal of the PMOS transistor MP217b, a gate terminal of the PMOS transistor MP218b and a drain terminal of the PMOS transistor MP218b respectively, and a drain terminal of the PMOS transistor MP219b is coupled to a gate terminal of the PMOS transistor MP217b. One end of the capacitor C222b is coupled to a third clock output terminal CLK+ of the four-phase non-overlap clock circuit 204, and another end of the capacitor C222b is coupled to a drain terminal of the PMOS transistor MP219b. One end of the capacitor C223b is coupled to a fourth clock output terminal CLK− of the four-phase non-overlap clock circuit 204, and another end of the capacitor C223b is coupled to a gate terminal of the PMOS transistor MP219b.

With reference to FIG. 5 together with FIGS. 1 to 4, the role of the second charge pump 202 in this embodiment to generate a continuously adjustable negative bias voltage from −Vmax to −Vmax/2. The PMOS transistors MP211b and MP212b control the voltages of the substrates of the PMOS transistors MP213b and MP219b to be always equal to the highest of the voltages at the source terminal and the drain terminal of the PMOS transistor MP213b, to prevent a positively biased PN junction forming between the source or drain terminal and the substrate of each of the PMOS transistors MP213b and MP219b. The PMOS transistors MP214b and MP216b control the voltages of the substrates of the PMOS transistors MP215b, MP217b, MP218b to be always equal to the highest of the voltages at the source terminal and the drain terminal of the PMOS transistor MP215b, to prevent a positively biased PN junction forming between the source or drain terminal and the substrate of each of the PMOS transistors MP215b, MP217b and MP218b. The voltage at the source terminal of the MP218b is an output voltage of the second charge pump 202. The second charge pump 202 works similarly to the first charge pump 201, and the final output voltage of the second charge pump 202 is stored on the capacitor C210a in the first charge pump 201, so that the voltage across the capacitor C210a is the negative voltage Vstr− output by the first charge pump 201 and the second charge pump 202 connected in parallel.

It should be noted that the second charge pump 202 may have a variety of circuit configurations, and only one circuit configuration is described in this embodiment, which does not limit the scope of the present disclosure.

Figure 6:
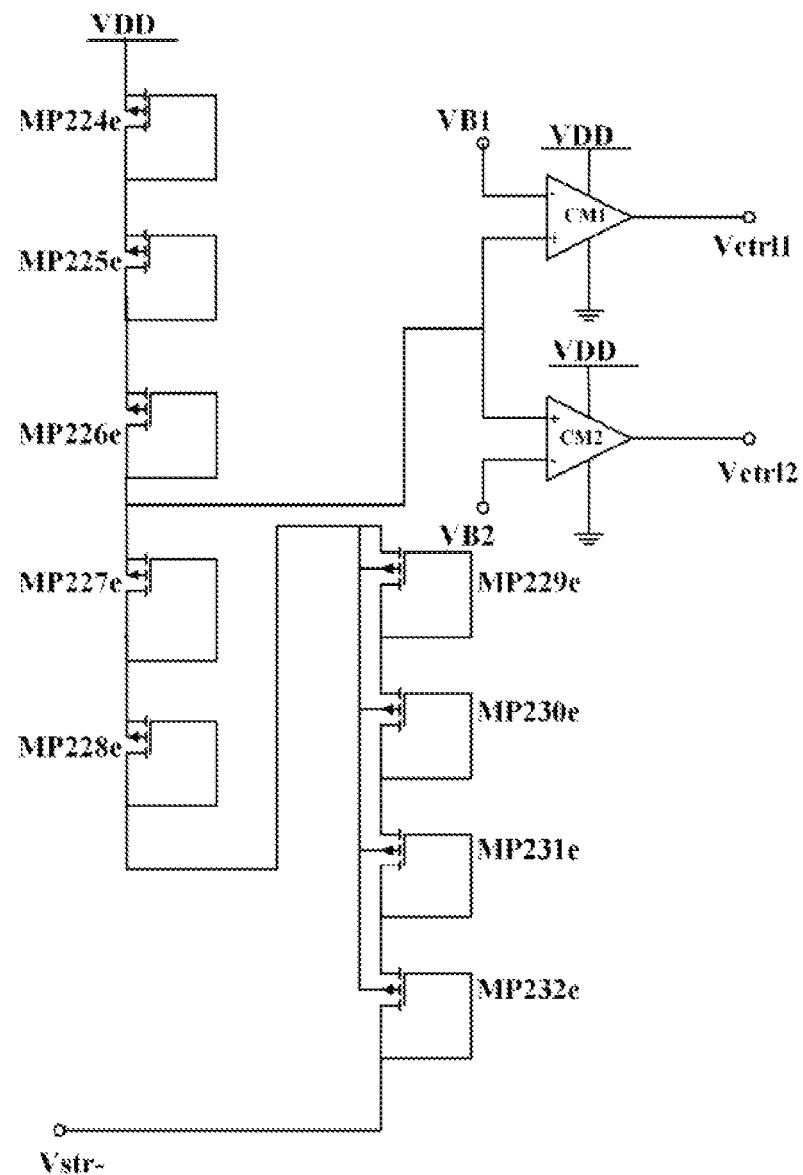
FIG. 6 is a schematic diagram illustrating a voltage division control circuit according to one embodiment of the present disclosure.

In an alternative embodiment, with reference to FIG. 6 together with FIGS. 1 to 5, the voltage division control circuit 205 may include PMOS transistors MP224e, MP225e, MP226e, MP227e, MP228e, MP229e, MP230e, MP231e and MP232e, and comparators CM1, CM2. Each of the PMOS transistors MP224e, MP225e, MP226e, MP227e and MP228e has a substrate, a source terminal coupled to the substrate, a drain terminal, and a gate terminal coupled to the drain terminal. Each of the PMOS transistors MP229e, MP230e, MP231e and MP232e has a substrate coupled to a source terminal of the PMOS transistor MP229e, and further has a drain terminal, and a gate terminal coupled to the drain terminal. The source terminal of the PMOS transistor MP224e is coupled to the voltage source, and a drain terminal of the PMOS transistor MP224e is coupled to a source terminal of the PMOS transistor MP225e. The source terminal of the PMOS transistor MP226e is coupled to a drain terminal of the PMOS transistor MP225e, a drain terminal of the PMOS transistor MP226e is coupled to a first input terminal of the comparator CM1, a first input terminal of the comparator CM2 and a source terminal of the PMOS transistor MP227e respectively. A source terminal of the PMOS transistor MP228e is coupled to a drain terminal of the PMOS transistor MP227e, and a drain terminal of the PMOS transistor MP228e is coupled to a source terminal of the PMOS transistor MP229e. A source terminal of the PMOS transistor MP230e is coupled to a drain terminal of the PMOS transistor MP229e, and a drain terminal of the PMOS transistor MP230e is coupled to a source terminal of the PMOS transistor MP231e. A source terminal of the PMOS transistor MP232e is coupled to a drain terminal of the PMOS transistor MP231e, and a drain terminal of the PMOS transistor MP232e is coupled to an output terminal of the first charge pump 201 and an output terminal of the second charge pump 202 respectively. A second input terminal of the comparator CM1 is coupled to a first bias voltage VB1, and a second input terminal of the comparator CM2 is coupled to a second bias voltage VB2. An output terminal of the comparator CM1 is a first control signal output terminal of the voltage division control circuit 205, and an output terminal of the comparator CM2 is a second control signal output terminal of the voltage division control circuit 205.

With reference to FIG. 6 together with FIGS. 1 to 5, the role of the voltage division control circuit 205 is to generate a positive voltage V+ linearly correlative to the negative voltage Vstr−, and to compare the positive voltage V+ with VB1 and VB2 through the comparators CM1 and CM2, to control the first charge pump 201, the second charge pump 202, the two-phase non-overlap clock circuit 203, and the four-phase non-overlap clock circuit 204. In order to reduce the effect of the threshold voltage Vth, the substrates of the PMOS transistors MP224a~MP228e are directly coupled to their respective source terminals, and all the substrates of the PMOS transistors MP229e~MP232e are coupled to the source terminal of the MP229e. The voltage division control circuit 205 works as below. If both the controllable switches S1 and S2 are switched off, the transformed positive voltage V+ is compared with VB2, and when this voltage is larger than VB2, the comparator CM2 outputs a high level voltage, the controllable switches S4 and S6 are switched on, and the controllable switches S3 and S5 are switched off, the two-phase non-overlap clock circuit 203 and the first charge pump 201 begin to work, and the four phase non-overlap clock circuit 204 and the second charge pump 202 stop working. When the positive voltage V+ is lower than VB2, the comparator CM2 outputs a low level voltage, the controllable switches S4 and S6 are switched off, the controllable switches S3 and S5 are switched on, the two-phase non-overlap clock 203 and the first charge pump 201 stop working, and the four-phase non-overlap clock 204 and the second charge pump 202 begin to work. Therefore, when a negative bias voltage of −Vmax/2 to 0 V is required, the voltage division control circuit 205 may select the first charge pump 201 (a first-stage charge pump) to work, and the transmission efficiency of the charge pump is high at this time. When a negative bias voltage of −Vmax to −Vmax/2 is required, the voltage division control circuit 205 may select the second charge pump 202 (a second-stage charge pump) to work, a very low negative voltage may be generated and the transmission efficiency of the charge pump may be ensured at this time. By combining the above two portions, it is possible to reduce the duration of usage of the two charge pumps under high pressure, to improve the reliability of the charge pumps. Even when there is a failure in one portion, the function of another portion can be performed by adjusting VB2. For the control of the controllable switches S1, S2, the comparator CM1 compares the positive voltage V+ with VB1. When the positive voltage V+ is larger than the VB1, the comparator CM1 outputs a high level voltage, and the controllable switches S1 and S2 are switched off. At this time, one of the four-phase non-overlap clock circuit 204 and the two-phase non-overlap clock circuit 201 is in a working state, and the corresponding second charge pump 202 or first charge pump 201 is also in a working stat. The output negative voltage Vstr– continues to drop, and the positive voltage V+ linearly correlative to the negative voltage Vstr– also continues to drop. When V+ drops to be below VB1, the comparator CM1 outputs a low level voltage, both the controllable switches S1 and S2 are switched off, and both the charge pumps stop working. Since the increase of the output voltage Vstr– caused by the discharge of the capacitor C210a, the positive voltage V+ linearly correlative to the negative voltage Vstr– will be greater than the VB1. Therefore the above processes will be repeated. In this way, the first bias voltage VB1 can control the output voltage of the two charge pumps to stabilize at a certain voltage value.

Figure 7:
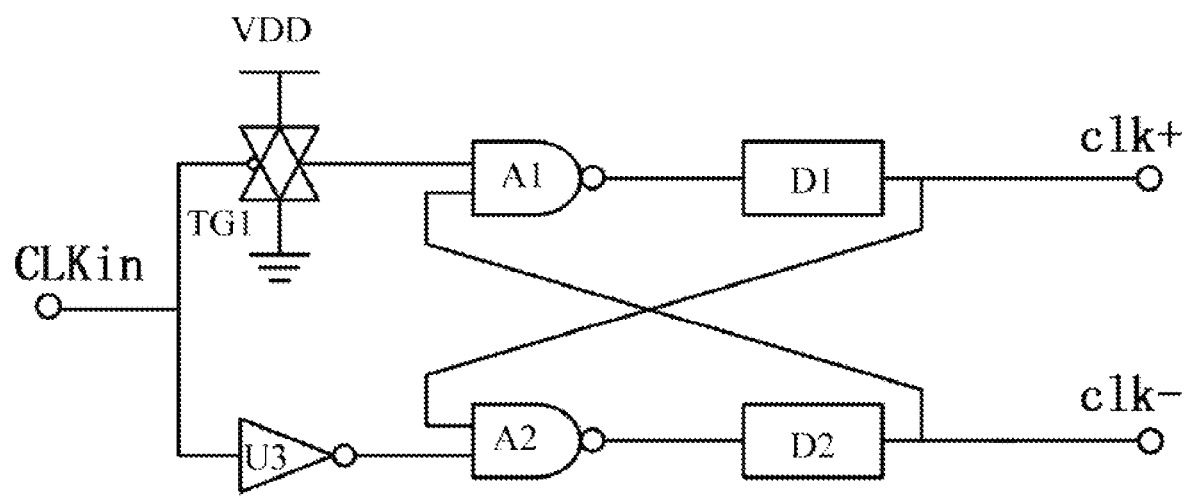
FIG. 7 is a schematic diagram illustrating a two-phase non-overlap clock circuit according to one embodiment of the present disclosure.

In an alternative embodiment, as shown in FIG. 7, the two-phase non-overlap clock circuit 203 in this embodiment may include a transmission gate TG1, NAND gates A1 and A2, delayers D1 and D2 and an inverter U3. An input terminal of the transmission gate TG1 is a clock input terminal, the input terminal of the transmission gate TG1 is coupled to an input terminal of the inverter U3, an output terminal of the transmission gate TG1 is coupled to a first input terminal of the NAND gate A1, a first control terminal of the transmission gate TG1 is coupled to the voltage source, and a second control terminal of the transmission gate TG1 is grounded.

A second input terminal of the NAND gate A1 is coupled to an output terminal of the delayer D2 and an output terminal of the NAND gate A1 is coupled to an input terminal of the delayer D1. A first input terminal of the NAND gate A2 is coupled to an output terminal of the delayer D1, a second input terminal of the NAND gate A2 is coupled to an output terminal of the inverter U3, and an output terminal of the NAND gate A2 is coupled to an input terminal of the delayer D2. An output terminal of the delayer D2 is the first clock output terminal of two-phase non-overlap clock circuit, and an output terminal of the delayer D1 is the second clock output terminal of the two-phase non-overlap clock circuit.

In this embodiment, with reference to the circuit configuration as shown in FIG. 7, the two-phase non-overlap clock circuit 203 may generate two clock signals with non-overlapped phase to each other. Of course, it is also possible to design other circuit configurations to generate two clock signals with non-overlapped phase to each other, which is not described in detail in this embodiment.

Figure 8:
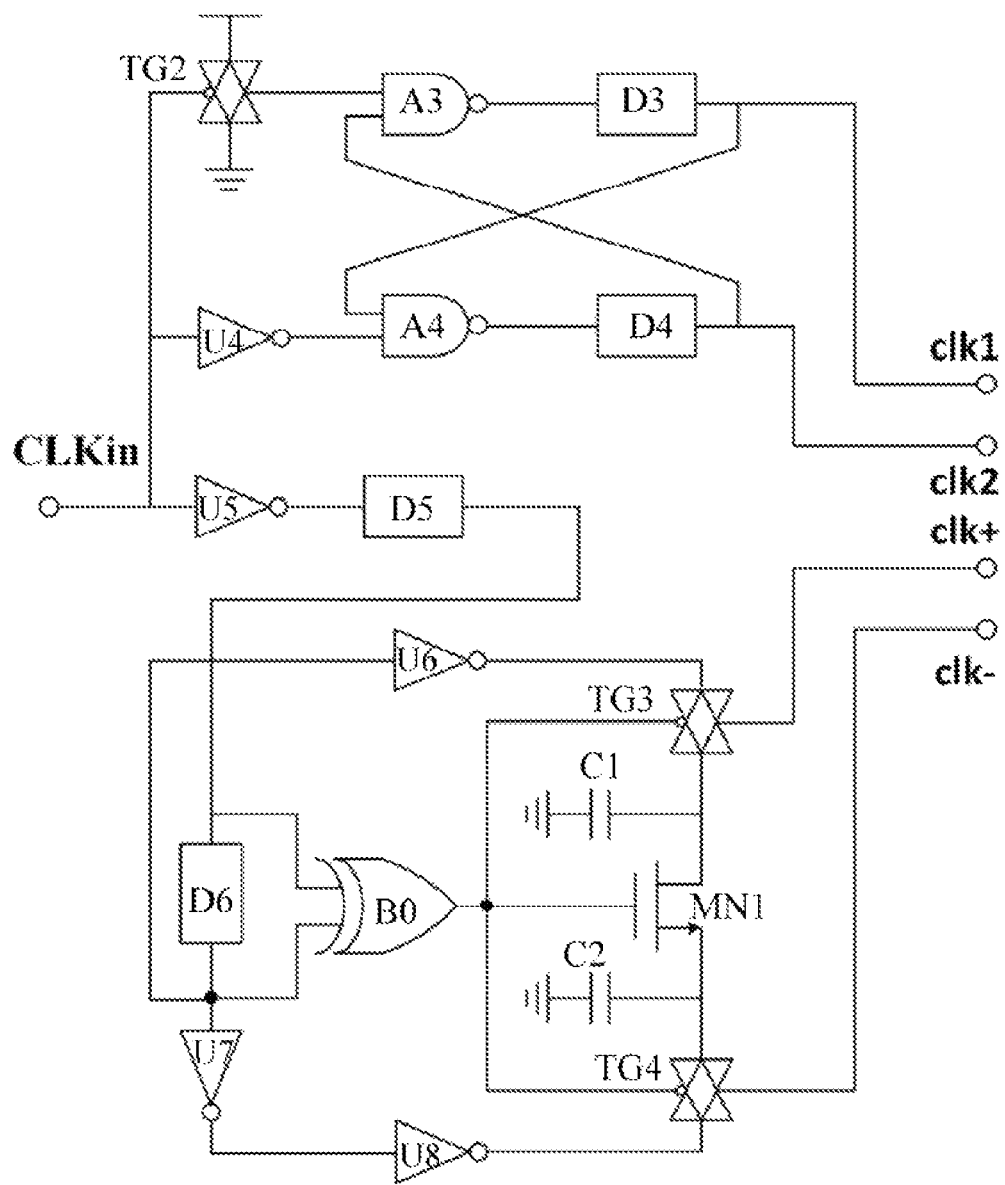
FIG. 8 is a schematic diagram illustrating a four-phase non-overlap clock circuit according to one embodiment of the present disclosure.

In an alternative embodiment, as shown in FIG. 8, the four-phase non-overlap clock circuit 204 in this embodiment may include transmission gates TG2, TG3 and TG4, NAND gates A3 and A4, delayers D3, D4, D5 and D6, inverters U4, U5, U6, U7 and U8, an exclusive-OR gate B0, capacitors C1 and C2 and a NMOS transistor MN1.

An input terminal of the transmission gate TG2 is a clock input terminal, the input terminal of the transmission gate TG2 is coupled to an input terminal of the inverter U4 and an input terminal of the inverter U5 respectively, a first control terminal of the transmission gate TG2 is coupled to the voltage source, a second control terminal of the transmission gate TG2 is grounded, and an output terminal of the transmission gate TG2 is coupled to a first input terminal of the NAND gate A3.

A second input terminal of the NAND gate A3 is coupled to an output terminal of the delayer D4, and an output terminal of the NAND gate A3 is coupled to an input terminal of the delayer D3. A first input terminal of the NAND gate A4 is coupled to an output terminal of the delayer D3, a second input terminal of the NAND gate A4 is coupled to an output terminal of the inverter U4, and an output terminal of the NAND gate A4 is coupled to an input terminal of the delayer D4.

An input terminal of the delayer D5 is coupled to an output terminal of the inverter U5, and an output terminal of the delayer D5 is coupled to an input terminal of the delayer D6 and a first input terminal of the exclusive-OR gate B0 respectively. An output terminal of the delayer D6 is coupled to an input terminal of the inverter U6, an input terminal of the inverter U7 and a second input terminal of the exclusive-OR gate B0 respectively, and an output terminal of the inverter U7 is coupled to an input terminal of the inverter U8.

An input terminal of the transmission gate TG3 is coupled to an output terminal of the exclusive-OR gate B0, a first control terminal of the transmission gate TG3 is coupled to an output terminal of the inverter U6, and a second control terminal of the transmission gate TG3 is grounded through the capacitor C1. A gate terminal of the NMOS transistor MN1 is coupled to an output terminal of the exclusive-OR gate B0, a source terminal of the is NMOS transistor MN1 is grounded through the capacitor C2, and a drain terminal of the NMOS transistor MN1 is coupled to a second control terminal of the transmission gate TG3. An input terminal of the transmission gate TG4 is coupled to an output terminal of the exclusive-OR gate B0, a first control terminal of the transmission gate TG4 is coupled to a source terminal of the NMOS transistor MN1, and a second control terminal of the transmission gate TG4 is coupled to the output terminal of the inverter U8.

Figure 9:
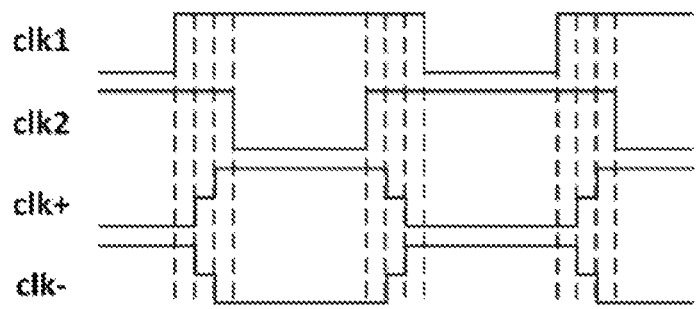
FIG. 9 is a schematic diagram illustrating four clock signals with non-overlapped phases to each other generated by a four-phase non-overlap clock circuit according to one embodiment of the present disclosure.

As shown, an output terminal of the delayer D3 is the first clock output terminal of the four-phase non-overlap clock circuit 204, an output terminal of the delayer D4 is the second clock output terminal of the four-phase non-overlap clock circuit 204, an output terminal of the transmission gate TG3 is the third clock output terminal of the four-phase non-overlap clock circuit 204, and an output terminal of the transmission gate TG4 is the fourth clock output terminal of the four-phase non-overlap clock circuit 204. The four-phase non-overlap clock circuit 203 in this embodiment may generate four clock signals with non-overlapped phase to each other. FIG. 9 shows four clock signals generated by the four-phase non-overlap clock circuit in this. Of course, it is also possible to design other circuit configurations to generate four clock signals with non-overlapped phase to each other, which is not described in detail in this embodiment.

Figure 10:
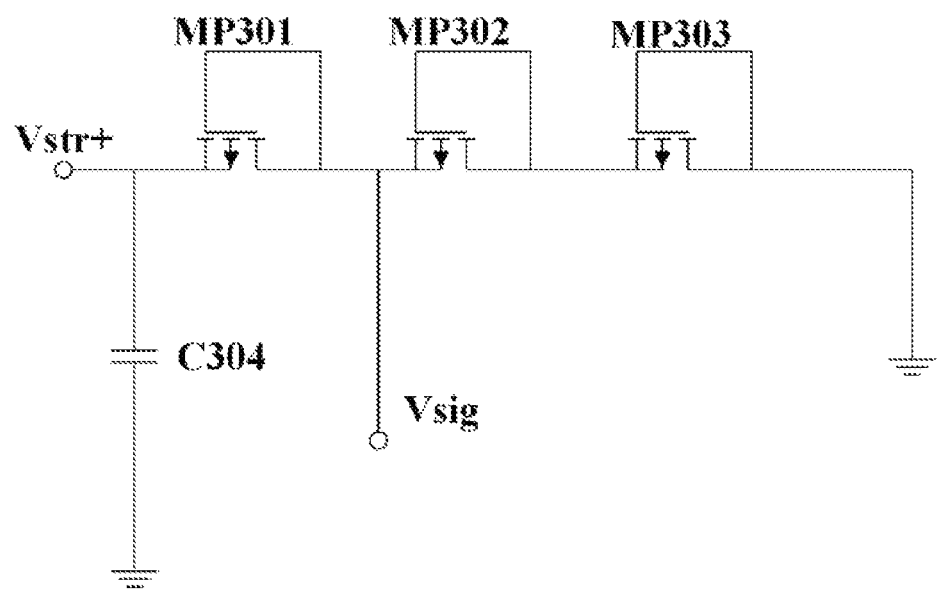
FIG. 10 is a schematic diagram illustrating a circuit configuration of a buck module according to one embodiment of the present disclosure.

In an alternative embodiment, as shown in FIG. 10, the buck module 300 may include PMOS transistors MP301, MP302 and MP303, and a capacitor C304. Each of the PMOS transistors MP301, MP302, MP303 has a drain terminal and a gate terminal coupled to the drain terminal. The capacitor C304 is a test capacitor, one end of the capacitor C304 is grounded, and another end of the capacitor C304 is coupled to a source terminal of the PMOS transistor MP301 and an output terminal of the positive voltage stress generation module 100 respectively. A source terminal of the PMOS transistor MP302 is coupled to a drain terminal of the PMOS transistor MP301, a drain terminal of the PMOS transistor MP302 is coupled to a source terminal of the PMOS transistor MP303, and a drain terminal of the PMOS transistor MP303 is grounded.

In this embodiment, the buck module 300 may reduce the voltage of the high stress voltage output from the first charge pump 201 and the second charge pump 202, to avoid the high stress voltage directly applied on the transistors of the warning output module, to protect the safety of the device and improve the prediction accuracy of the ESD failure early warning circuit.

Figure 11:
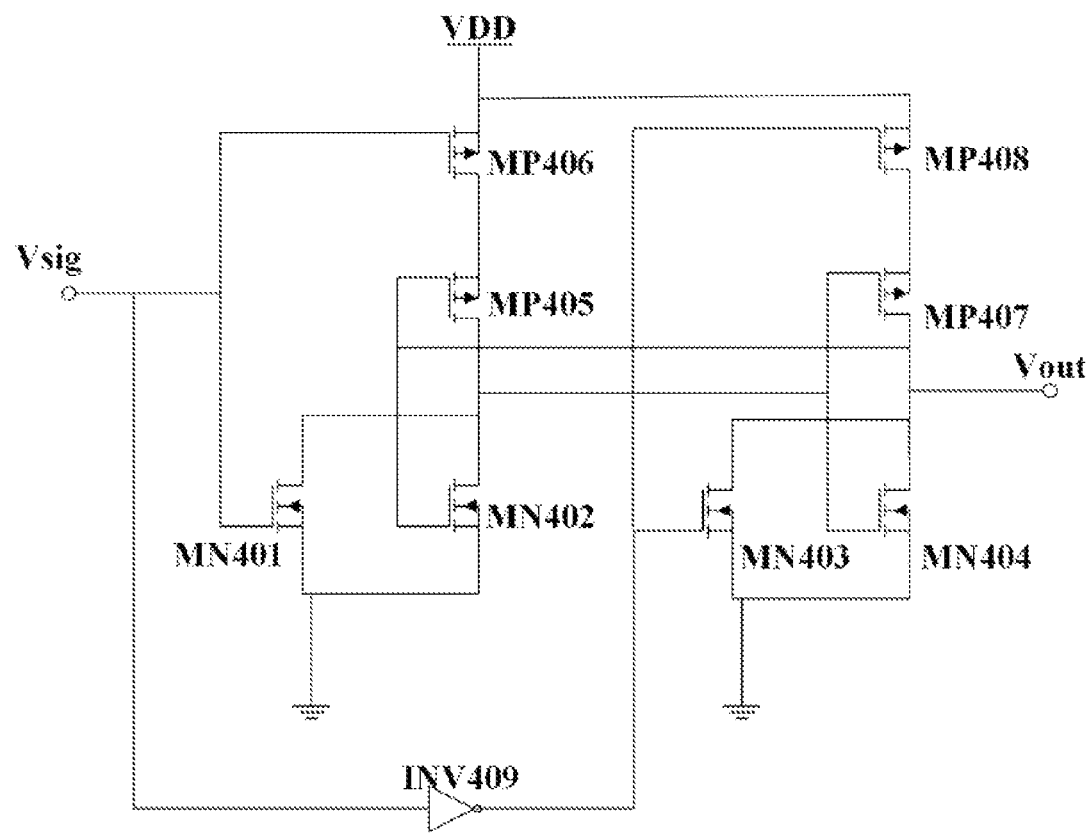
FIG. 11 is a schematic diagram illustrating a circuit configuration of a warning output module according to one embodiment of the present disclosure.

In an alternative embodiment, the warning output module 400 is in a form of a latch made up of two NOR gates and one inverter. As shown in FIG. 11, the warning output module may include NMOS transistors MN401, MN402, MN403 and MN404, PMOS transistors MP406, MP406 and MP408, and an inverter INV409.

Each of the NMOS transistors MN401, MN402, MN403 and MN404 and the PMOS transistors MP405, MP406, MP407 and MP408 has a substrate and a source terminal coupled to the substrate. A gate terminal of the NMOS transistor MN401 is coupled to an output terminal of the buck module 300 and a gate terminal of the PMOS transistor MP406 respectively, a source terminal of the NMOS transistor MN401 is grounded, and a drain terminal of the NMOS transistor MN401 is coupled to a drain terminal of the NMOS transistor MN402, a drain terminal of the PMOS transistor MP405, a gate terminal of the PMOS transistor MP407 and a gate terminal of the NMOS transistor MN404 respectively.

A gate terminal of the NMOS transistor MN402 is coupled to a gate terminal of the PMOS transistor MP405, a drain terminal of the PMOS transistor MP407, a drain terminal of the NMOS transistor MN404 and a drain terminal of the NMOS transistor MN403 respectively, and a source terminal of the NMOS transistor MN402 is grounded.

A source terminal of the PMOS transistor MP406 is coupled to the voltage source, and a drain terminal of the PMOS transistor MP406 is coupled to a source terminal of the PMOS transistor MP405. An input terminal of the inverter INV409 is coupled to an output terminal of the buck module, and an output terminal of the inverter INV409 is coupled to a gate terminal of the PMOS transistor MP408 and a gate terminal of the NMOS transistor MP403 respectively. A source terminal of the PMOS transistor MP408 is coupled to the voltage source, and a drain terminal of the PMOS transistor MP408 is coupled to a source terminal of the PMOS transistor MP407. A source terminal of each of the NMOS transistors MN403 and MN404 is grounded.

With reference to FIG. 11 together with FIGS. 1 and 10, the NMOS transistors MN401 and MN402 and the PMOS transistors MP405 and MP406 form a NOR gate (called a NOR gate A), and the NMOS transistors MN403 and MN404 and PMOS transistors MP407 and MP408 form another NOR gate (called NOR gate B). FIG. 9 shows that two input terminals of the NOR gate are coupled to the output terminal Vsig of the buck module 300 and an output terminal of the NOR gate B respectively, two input terminals of the NOR gate B are coupled to an output terminal of the NOR gate A and the output terminal of the inverter INV409 respectively, and an output terminal Vout of the NOR gate terminal B is the output terminal of the warning output module 400. When all the test capacitors are not broken down, the input terminal of the warning output module 400 in a form of a latch is at a high level voltage, and the warning output module 400 outputs a high level voltage. If one of the test capacitors is broken down, the input terminal of the warning output module 400 becomes a low level voltage, the warning output module 400 outputs a low level voltage, and a warning signal is transmitted. In this case, the positive voltage stress generation module 100 and the negative voltage stress generation module 200 are switched off by the feedback control circuit to avoid excess power loss.

In conclusion, the voltage value of the positive stress voltage or the negative stress voltage in the ESD failure early warning circuit according to the present disclosure can be customized by a user, with good flexibility. In addition, the charge pump in the circuit is characterized by high reliability. With the technical solution provided in the present disclosure, the failure of the integrated circuit caused by ESD can be early warned.

The technical features in the embodiments above may be implemented in any combination. For the purpose of simplicity, not all combinations are described herein. However, such combination should all be considered within the scope of the present disclosure provide that there is no contradiction.

The detailed embodiments described herein are only for the purpose of illustrating the present disclosure, and are not intended to limit the scope of the present disclosure in any way. It would be understand by a person skilled in the art that various changes and modifications can be made to the embodiments described herein without departing from the scope and spirit of the present disclosure. Such changes and modifications are contemplated by the present disclosure, the scope of which should only be defined by the following claims.

What is claimed is:

1. An ESD failure early warning circuit for an integrated circuit, comprising: a positive voltage stress generation module, a negative voltage stress generation module, a buck module, a warning output module, capacitors C006 and C007, and diodes D001, D002, D003, D004 and D005, wherein:
   one end of the capacitor C007 is coupled to an output terminal of the positive voltage stress generation module and another end of the capacitor C007 is grounded;
   an anode terminal of the diode D005 is grounded, and a cathode terminal of the diode D005 is coupled to an output terminal of the positive voltage stress generation module and an input terminal of the buck module respectively;
   one end of the capacitor C006 is coupled to the cathode terminal of the diode D005, and another end of the capacitor C006 is coupled to an output terminal of the negative voltage stress generation module and an anode terminal of the diode D003 respectively;
   a cathode terminal of the diode D004 is coupled to the output terminal of the positive voltage stress generation module, and an anode terminal of the diode D004 is coupled to an cathode terminal of the diode D003, an anode terminal of the diode D001 and a cathode terminal of the diode D002 respectively;
   a cathode terminal of the diode D001 is coupled to a voltage source, and an anode terminal of the diode D002 is grounded; and
   an input terminal of the warning output module is coupled to an output terminal of the buck module.

2. The ESD failure early warning circuit of claim 1, further comprising a controllable switch S001 and a controllable switch S002, wherein:
   a clock input terminal of the positive voltage stress generation module is coupled to an external clock signal through the controllable switch S002, and a clock input terminal of the negative voltage stress generation module is coupled to an external clock signal through the controllable switch S001; and an output terminal of the warning output module is coupled to a control terminal of the controllable switch S001 and a control terminal of the controllable switch S002 respectively.

3. The ESD failure early warning circuit of claim 1, wherein the positive voltage stress generation module includes capacitors C101 and C102, a NMOS transistor MN101, and PMOS transistors MP102, MP103 and MP104;
- each of the PMOS transistors MP103 and MP104 has a substrate and a source terminal coupled to the substrate;
- one end of the capacitor C102 is the clock input terminal of the positive voltage stress generation module, and another end of the capacitor C102 is coupled to a source terminal of the NMOS transistor MN101;
- a gate terminal and a drain terminal of the NMOS transistor MN101 are coupled to the voltage source, a source terminal of the NMOS transistor MN101 is coupled to a source terminal of the PMOS transistor MP102, a drain terminal of the PMOS transistor MP103 and a gate terminal of the PMOS transistor MP104 respectively, a substrate of the NMOS transistor MN101 is grounded;
- one end of the capacitor C101 is grounded, and another end of the capacitor C101 is coupled to a drain terminal and a gate terminal of the PMOS transistor MP102 respectively; and
- a drain terminal of the PMOS transistor MP102 is coupled to a gate terminal of the PMOS transistor MP103 and a drain terminal of PMOS transistor MP104 respectively, a substrate of the PMOS transistor MP102 is coupled to a source terminal of the PMOS transistor MP103 and a source terminal of the PMOS transistor MP104 respectively.

4. The ESD failure early warning circuit of claim 1, wherein the negative voltage stress generation module includes controllable switches S1, S2, S3, S4, S5 and S6, a first charge pump, a second charge pump, a two-phase non-overlap clock circuit, a four-phase non-overlap clock circuit, inverters U1 and U2, and a voltage division control circuit;
- each of the controllable switches S1, S2, S3, S4, S5 and S6 includes a first terminal, a second terminal, and a control terminal configured to control the first terminal and the second terminal to be switched on;
- the first terminal of the controllable switch S2 is coupled to the second terminal of the controllable switch S4, the second terminal of the controllable switch S2 is coupled to a clock input terminal of the two-phase non-overlap clock circuit, and a clock output terminal of the two-phase non-overlap clock circuit is coupled to a clock input terminal of the first charge pump;
- the first terminal of the controllable switch S1 is coupled to the second terminal of the controllable switch S3, the second terminal of the controllable switch S1 is coupled to a clock input terminal of the four-phase non-overlap clock circuit, and a clock output terminal of the four-phase non-overlap clock circuit is coupled to a clock input terminal of the second charge pump;
- the first terminal of the controllable switch S3 is a clock input terminal of the negative voltage stress generation module, and the first terminal of the controllable switch S3 is coupled to the first terminal of the controllable switch S4;
- the first terminal of each of the controllable switches S5 and S6 is coupled to the voltage source, the second terminal of the controllable switch S6 is coupled to a voltage input terminal of the first charge pump, the second terminal of the controllable switch S5 is coupled to a voltage input terminal of the second charge pump, and both an output terminal of the first charge pump and an output terminal of the second charge pump are coupled to an input terminal of the voltage division control circuit;
- a first control signal output terminal of the voltage division control circuit is coupled to the control terminal of each of the controllable switches S1 and S2 respectively, a second control signal output terminal of the voltage division control circuit is coupled to the control terminal of each of the controllable switches S4, S6, an input terminal of the inverter U1 and an input terminal of the inverter U2 respectively; and
- an output terminal of the inverter U1 is coupled to the control terminal of the controllable switch S3, and an output terminal of the inverter U2 is coupled to the control terminal of the controllable switch S5.

5. The ESD failure early warning circuit of claim 4, wherein the first charge pump includes capacitors C208a, C209a and C210a, and PMOS transistors MP201a, MP202a, MP203a, MP204a, MP205a, MP206a and MP207a;
- each of the PMOS transistors MP202a, MP203a, MP205a and MP206a has a substrate and a source terminal coupled to the substrate;
- one end of the capacitor C208a is coupled to a first clock output terminal of the two-phase non-overlap clock circuit, and another end of the capacitor C208a is coupled to a drain terminal of the PMOS transistor MP206a;
- a gate terminal of the PMOS transistor MP204a is coupled to a second clock output terminal of the two-phase non-overlap clock circuit through the capacitor C209a, a drain terminal of the PMOS transistor MP204a is coupled to a drain terminal of the PMOS transistor MP206a, a gate terminal of the PMOS transistor MP201a and a gate terminal of the PMOS transistor MP205a respectively, a source terminal of the PMOS transistor MP204a is coupled to a drain terminal of the PMOS transistor MP205a, a gate terminal of the PMOS transistor MP206a, a drain terminal of the PMOS transistor MP201a, a drain terminal of the PMOS transistor MP202a and a gate terminal of the PMOS transistor MP203a respectively, and a substrate of the PMOS transistor MP204a is coupled to a source terminal of the PMOS transistor MP205a and a source terminal of the PMOS transistor MP206a respectively, and a drain terminal of the PMOS transistor MP205a is a voltage input terminal;
- a source terminal of the PMOS transistor MP201a is coupled to a gate terminal of the PMOS transistor MP204a, a drain terminal and a gate terminal of the PMOS transistor MP207a, a drain terminal of the PMOS transistor MP203a and a gate terminal of the PMOS transistor MP202a respectively, and a substrate of the PMOS transistor MP201a is coupled to a substrate of the PMOS transistor MP207a, a source terminal of the PMOS transistor MP202a, and a source terminal of the PMOS transistor MP203a respectively; and
- one end of the capacitor C210a is grounded, and another end of the capacitor C210a is coupled to a source terminal of the PMOS transistor MP207a.

6. The ESD failure early warning circuit of claim 5, wherein the two-phase non-overlap clock circuit includes a transmission gate TG1, NAND gates A1, A2, delayers D1, D2 and an inverter U3;

an input terminal of the transmission gate TG1 is a clock input terminal, the input terminal of the transmission gate TG1 is coupled to an input terminal of the inverter U3, an output terminal of the transmission gate TG1 is coupled to a first input terminal of the NAND gate A1, a first control terminal of the transmission gate TG1 is coupled to the voltage source, and a second control terminal of the transmission gate TG1 is grounded;

a second input terminal of the NAND gate A1 is coupled to an output terminal of the delayer D2 and an output terminal of the NAND gate A1 is coupled to an input terminal of the delayer D1;

a first input terminal of the NAND gate A2 is coupled to an output terminal of the delayer D1, a second input terminal of the NAND gate A2 is coupled to an output terminal of the inverter U3, and an output terminal of the NAND gate A2 is coupled to an input terminal of the delayer D2;

an output terminal of the delayer D2 is the first clock output terminal of two-phase non-overlap clock circuit, and an output terminal of the delayer D1 is the second clock output terminal of the two-phase non-overlap clock circuit.

7. The ESD failure early warning circuit of claim 5, wherein the four-phase non-overlap clock circuit includes transmission gates TG2, TG3 and TG4, NAND gates A3 and A4, delayers D3, D4, D5 and D6, inverters U4, U5, U6, U7 and U8, an exclusive-OR gate B0, capacitors C1 and C2 and a NMOS transistor MN1;

an input terminal of the transmission gate TG2 is a clock input terminal, the input terminal of the transmission gate TG2 is coupled to an input terminal of the inverter U4 and an input terminal of the inverter U5 respectively, a first control terminal of the transmission gate TG2 is coupled to the voltage source, a second control terminal of the transmission gate TG2 is grounded, and an output terminal of the transmission gate TG2 is coupled to a first input terminal of the NAND gate A3;

a second input terminal of the NAND gate A3 is coupled to an output terminal of the delayer D4, and an output terminal of the NAND gate A3 is coupled to an input terminal of the delayer D3;

a first input terminal of the NAND gate A4 is coupled to an output terminal of the delayer D3, a second input terminal of the NAND gate A4 is coupled to an output terminal of the inverter U4, and an output terminal of the NAND gate A4 is coupled to an input terminal of the delayer D4;

an input terminal of the delayer D5 is coupled to an output terminal of the inverter U5, and an output terminal of the delayer D5 is coupled to an input terminal of the delayer D6 and a first input terminal of the exclusive-OR gate B0 respectively;

an output terminal of the delayer D6 is coupled to an input terminal of the inverter U6, an input terminal of the inverter U7 and a second input terminal of the exclusive-OR gate B0 respectively, and an output terminal of the inverter U7 is coupled to an input terminal of the inverter U8;

an input terminal of the transmission gate TG3 is coupled to an output terminal of the exclusive-OR gate B0, a first control terminal of the transmission gate TG3 is coupled to an output terminal of the inverter U6, and a second control terminal of the transmission gate TG3 is grounded through the capacitor C1;

a gate terminal of the NMOS transistor MN1 is coupled to an output terminal of the exclusive-OR gate B0, a source terminal of the is NMOS transistor MN1 is grounded through the capacitor C2, and a drain terminal of the NMOS transistor MN1 is coupled to a second control terminal of the transmission gate TG3;

an input terminal of the transmission gate TG4 is coupled to an output terminal of the exclusive-OR gate B0, a first control terminal of the transmission gate TG4 is coupled to a source terminal of the NMOS transistor MN1, and a second control terminal of the transmission gate TG4 is coupled to the output terminal of the inverter U8;

an output terminal of the delayer D3 is the first clock output terminal of the four-phase non-overlap clock circuit, an output terminal of the delayer D4 is the second clock output terminal of the four-phase non-overlap clock circuit, an output terminal of the transmission gate TG3 is the third clock output terminal of the four-phase non-overlap clock circuit, and an output terminal of the transmission gate TG4 is the fourth clock output terminal of the four-phase non-overlap clock circuit.

8. The ESD failure early warning circuit of claim 4, wherein the second charge pump includes capacitors C220*b*, C221*b*, C222*b* and C223*b*, and PMOS transistors MP211*b*, MP212*b*, MP213*b*, MP214*b*, MP215*b*, MP216*b*, MP217*b*, MP218*b* and MP219*b;* each of the PMOS transistors MP211*b*, MP212*b*, MP214*b* and MP216*b* has a substrate and a source terminal coupled to the substrate;

one end of the capacitor C220*b* is coupled to a first clock output terminal of the four-phase non-overlap clock circuit, and another end of the capacitor C220*b* is coupled to a drain terminal of the PMOS transistor MP211*b* and a gate terminal of the PMOS transistor MP215*b* respectively;

a gate terminal of the PMOS transistor MP213*b* is coupled to a source terminal of the PMOS transistor MP215*b*, a drain terminal of the PMOS transistor MP216*b*, a drain terminal of the PMOS transistor MP217*b*, and a source terminal of the PMOS transistor MP219*b* respectively, a source terminal of the PMOS transistor MP213*b* is coupled to a source terminal of the PMOS transistor MP211*b*, a drain terminal of the PMOS transistor MP212*b*, a drain terminal of the PMOS transistor MP214*b*, a drain terminal of the PMOS transistor MP215*b* and a gate terminal of the PMOS transistor MP216*b* respectively, a drain terminal of the PMOS transistor MP213*b* is coupled to a drain terminal of the PMOS transistor MP211*b* and a gate terminal of the PMOS transistor MP212*b* respectively, and a substrate of the PMOS transistor MP213*b* is coupled to a source terminal of the PMOS transistor MP211*b*, a source terminal of the PMOS transistor MP212*b*, and a substrate of the PMOS transistor MP219*b* respectively;

one end of the capacitor C221*b* is coupled to a second clock output terminal of the four-phase non-overlap clock circuit, and another end of the capacitor C221*b* is coupled to a gate terminal of the PMOS transistor MP213*b;* a source terminal of the PMOS transistor MP215*b* is coupled to a gate terminal of the PMOS transistor MP214*b*, a substrate of the PMOS transistor MP215*b* is coupled to a source terminal of the PMOS transistor MP214b, a source terminal of the PMOS transistor MP216b, a substrate of the PMOS transistor MP217b and a substrate of the PMOS transistor MP218b respectively, and a drain terminal of the PMOS transistor MP215b is a voltage input terminal;

a gate terminal of the PMOS transistor MP219b is coupled to a source terminal of the PMOS transistor MP217b, a gate terminal of the PMOS transistor MP218b and a drain terminal of the PMOS transistor MP218b respectively, and a drain terminal of the PMOS transistor MP219b is coupled to a gate terminal of the PMOS transistor MP217b;

one end of the capacitor C222b is coupled to a third clock output terminal of the four-phase non-overlap clock circuit, and another end of the capacitor C222b is coupled to a drain terminal of the PMOS transistor MP219b; and one end of the capacitor C223b is coupled to a fourth clock output terminal of the four-phase non-overlap clock circuit, and another end of the capacitor C223b is coupled to a gate terminal of the PMOS transistor MP219b.

9. The ESD failure early warning circuit of claim 4, wherein the voltage division control circuit includes PMOS transistors MP224e, MP225e, MP226e, MP227e, MP228e, MP229e, MP230e, MP231e and MP232e, and comparators CM1, CM2;

each of the PMOS transistors MP224e, MP225e, MP226e, MP227e and MP228e has a substrate, a source terminal coupled to the substrate, a drain terminal, and a gate terminal coupled to the drain terminal;

each of the PMOS transistors MP229e, MP230e, MP231e and MP232e has a substrate coupled to a source terminal of the PMOS transistor MP229e, and further has a drain terminal, and a gate terminal coupled to the drain terminal;

the source terminal of the PMOS transistor MP224e is coupled to the voltage source, and a drain terminal of the PMOS transistor MP224e is coupled to a source terminal of the PMOS transistor MP225e;

the source terminal of the PMOS transistor MP226e is coupled to a drain terminal of the PMOS transistor MP225e, a drain terminal of the PMOS transistor MP226e is coupled to a first input terminal of the comparator CM1, a first input terminal of the comparator CM2 and the source terminal of the PMOS transistor MP227e respectively;

a second input terminal of the comparator CM1 is coupled to a first bias voltage, a second input terminal of the comparator CM2 is coupled to a second bias voltage, an output terminal of the comparator CM1 is a first control signal output terminal of the voltage division control circuit, and an output terminal of the comparator CM2 is a second control signal output terminal of the voltage division control circuit;

the source terminal of the PMOS transistor MP228e is coupled to the drain terminal of the PMOS transistor MP227e, and the drain terminal of the PMOS transistor MP228e is coupled to the source terminal of the PMOS transistor MP229e;

the source terminal of the PMOS transistor MP230e is coupled to the drain terminal of the PMOS transistor MP229e, and the drain terminal of the PMOS transistor MP230e is coupled to the source terminal of the PMOS transistor MP231e; and the source terminal of the PMOS transistor MP232e is coupled to the drain terminal of the PMOS transistor MP231e, and the drain terminal of the PMOS transistor MP232e is coupled to an output terminal of the first charge pump and an output terminal of the second charge pump respectively.

10. The ESD failure early warning circuit of claim 1, wherein the buck module includes PMOS transistors MP301, MP302 and MP303 and a capacitor C304;

each of the PMOS transistors MP301, MP302 and MP303 has a drain terminal and a gate terminal coupled to the drain terminal;

one end of the capacitor C304 is grounded, and another end of the capacitor C304 is coupled to a source terminal of the PMOS transistor MP301 and an output terminal of the positive voltage stress generation module respectively; and a source terminal of the PMOS transistor MP302 is coupled to a drain terminal of the PMOS transistor MP301, a drain terminal of the PMOS transistor MP302 is coupled to a source terminal of the PMOS transistor MP303, and a drain terminal of the PMOS transistor MP303 is grounded.

11. The ESD failure early warning circuit of claim 1, wherein the warning output module includes: NMOS transistors MN401, MN402, MN403 and MN404, PMOS transistors MP405, MP406, MP407 and MP408 and an inverter INV409;

each of the NMOS transistors MN401, MN402, MN403 and MN404 and the PMOS transistors MP405, MP406, MP407 and MP408 has a substrate and a source terminal coupled to the substrate;

a gate terminal of the NMOS transistor MN401 is coupled to an output terminal of the buck module and a gate terminal of the PMOS transistor MP406 respectively, a source terminal of the NMOS transistor MN401 is grounded, and a drain terminal of the NMOS transistor MN401 is coupled to a drain terminal of the NMOS transistor MN402, a drain terminal of the PMOS transistor MP405, a gate terminal of the PMOS transistor MP407 and a gate terminal of the NMOS transistor MN404 respectively;

a gate terminal of the NMOS transistor MN402 is coupled to a gate terminal of the PMOS transistor MP405, a drain terminal of the PMOS transistor MP407, a drain terminal of the NMOS transistor MN404 and a drain terminal of the NMOS transistor MN403 respectively, and a source terminal of the NMOS transistor MN402 is grounded;

the source terminal of the PMOS transistor MP406 is coupled to the voltage source, and a drain terminal of the PMOS transistor MP406 is coupled to the source terminal of the PMOS transistor MP405;

an input terminal of the inverter INV409 is coupled to an output terminal of the buck module, and an output terminal of the inverter INV409 is coupled to a gate terminal of the PMOS transistor MP408 and a gate terminal of the NMOS transistor MP403 respectively;

the source terminal of the PMOS transistor MP408 is coupled to the voltage source, and a drain terminal of the PMOS transistor MP408 is coupled to the source terminal of the PMOS transistor MP407; and the source terminal of each of the NMOS transistors MN403 and MN404 is grounded.

* * * * *